(12) United States Patent
Yang (10) Patent No.: US 8,378,370 B2
(45) Date of Patent: Feb. 19, 2013

(54) LED PACKAGE STRUCTURE

(75) Inventor: Jun Yang, Zhongshan (CN)

(73) Assignees: Ambit Microsystems (Zhongshan) Ltd., Zhongshan (CN); Hon Hai Precision Industry Co., Ltd., New Taipei (TW)

( * ) Notice: Subject to any disclaimer, the term of this patent is extended or adjusted under 35 U.S.C. 154(b) by 43 days.

(21) Appl. No.: 13/149,940

(22) Filed: Jun. 1, 2011

(65) Prior Publication Data
US 2012/0261692 A1 Oct. 18, 2012

(30) Foreign Application Priority Data
Apr. 12, 2011 (CN) .......................... 2011 1 0091762

(51) Int. Cl.
*H01L 33/00* (2010.01)
*H01L 21/00* (2006.01)
(52) U.S. Cl. .................... 257/98; 257/99; 257/E33.059; 257/E33.061; 438/26
(58) Field of Classification Search .......................... None
See application file for complete search history.

(56) References Cited

U.S. PATENT DOCUMENTS
2008/0035942 A1* 2/2008 Kim et al. ......................... 257/98
2008/0297713 A1* 12/2008 Chen ............................. 349/152
2009/0189507 A1* 7/2009 Winkler et al. ............... 313/484

* cited by examiner

*Primary Examiner* — Julio J Maldonado
*Assistant Examiner* — Harpreet Singh
(74) *Attorney, Agent, or Firm* — Altis Law Group, Inc.

(57) ABSTRACT

A LED package structure includes a substrate, a LED chip and a colloid. The substrate includes a first surface and a second surface. An opening is shaped from the first surface toward the second surface. A phosphor layer is coated on the bottom surface with two opposite parts of the bottom surface respectively neighboring to two opposite side walls of the opening exposed. A metal layer is coated on the two exposed opposite parts of the bottom surface, the two opposite side walls and the first surface. The LED chip is received in the opening and configured on the phosphor layer. The LED chip includes a pair of conductive pads electrically connecting to the metal layer. The colloid is filled between the LED chip and the metal layer to attach the substrate to the LED chip.

12 Claims, 9 Drawing Sheets

LED PACKAGE STRUCTURE

BACKGROUND

1. Technical Field

The present disclosure generally relates to light emitting diode (LED) package structures, more particularly to a package structure for high-power LEDs.

2. Description of Related Art

Figure 9:
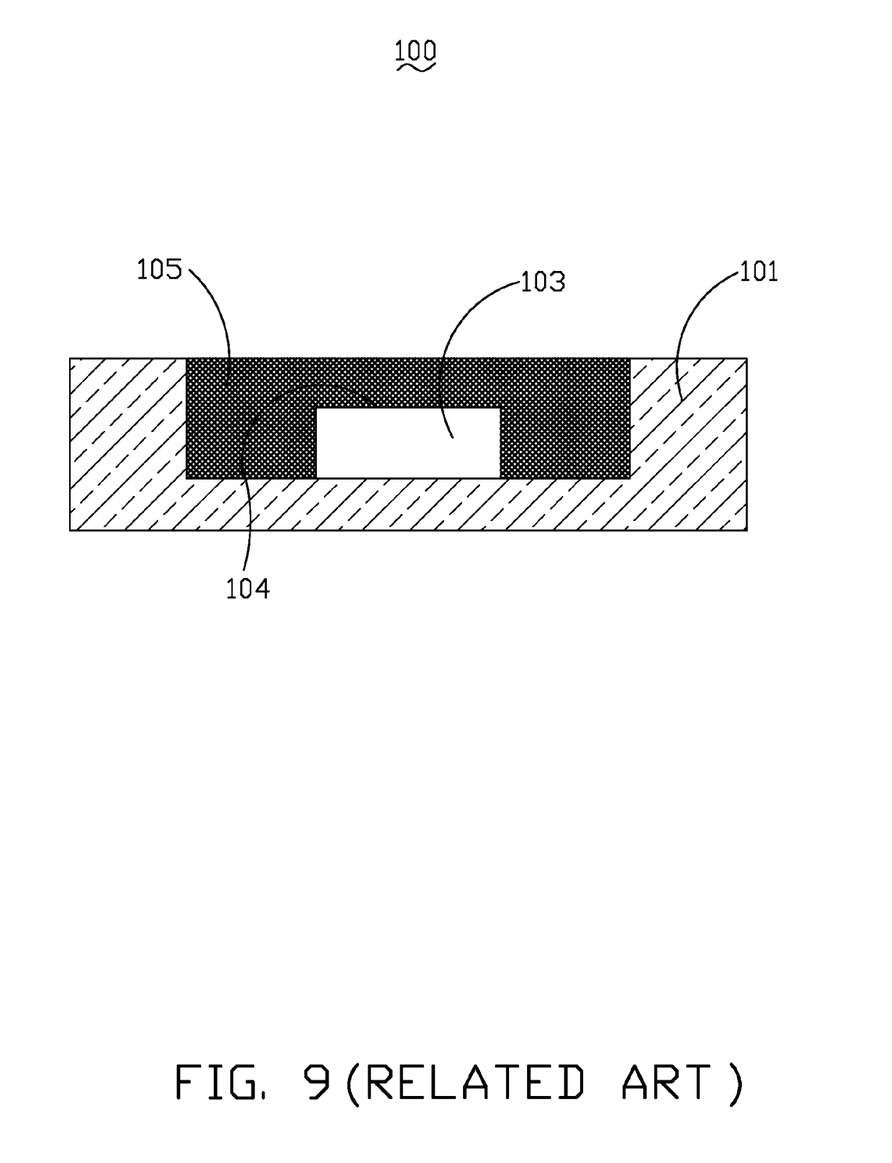
FIG. 9 is a schematic view of a LED package structure of prior art.

Referring to FIG. 9, a light emitting diode (LED) package structure 100 of prior art comprises a structure 101 defining an opening, a LED chip 103 received in the opening of the structure 101 and electrically connected to the structure 101 via a conductive wire 104, and a phosphor colloid 105 packet and attached with the structure 101 and the LED chip 103. However, massive amount of heat generated by the LED chip 103 cannot be effectively released out of the LED package structure 101, potentially shortening useful life of the LED chip 103.

Therefore, a need exists in the industry to overcome the described problem.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
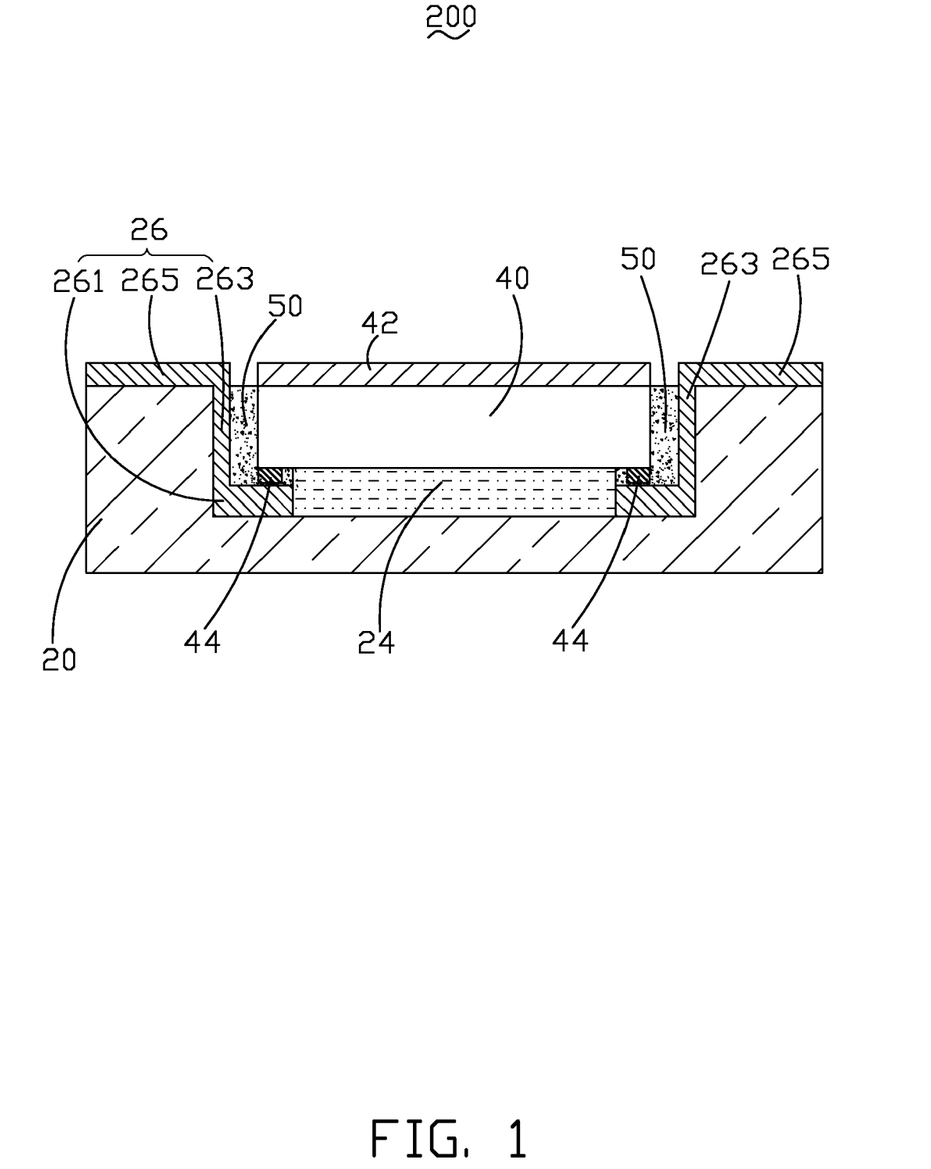
FIG. 1 is a schematic view of a LED package structure of an exemplary embodiment of the disclosure.
Figure 2:
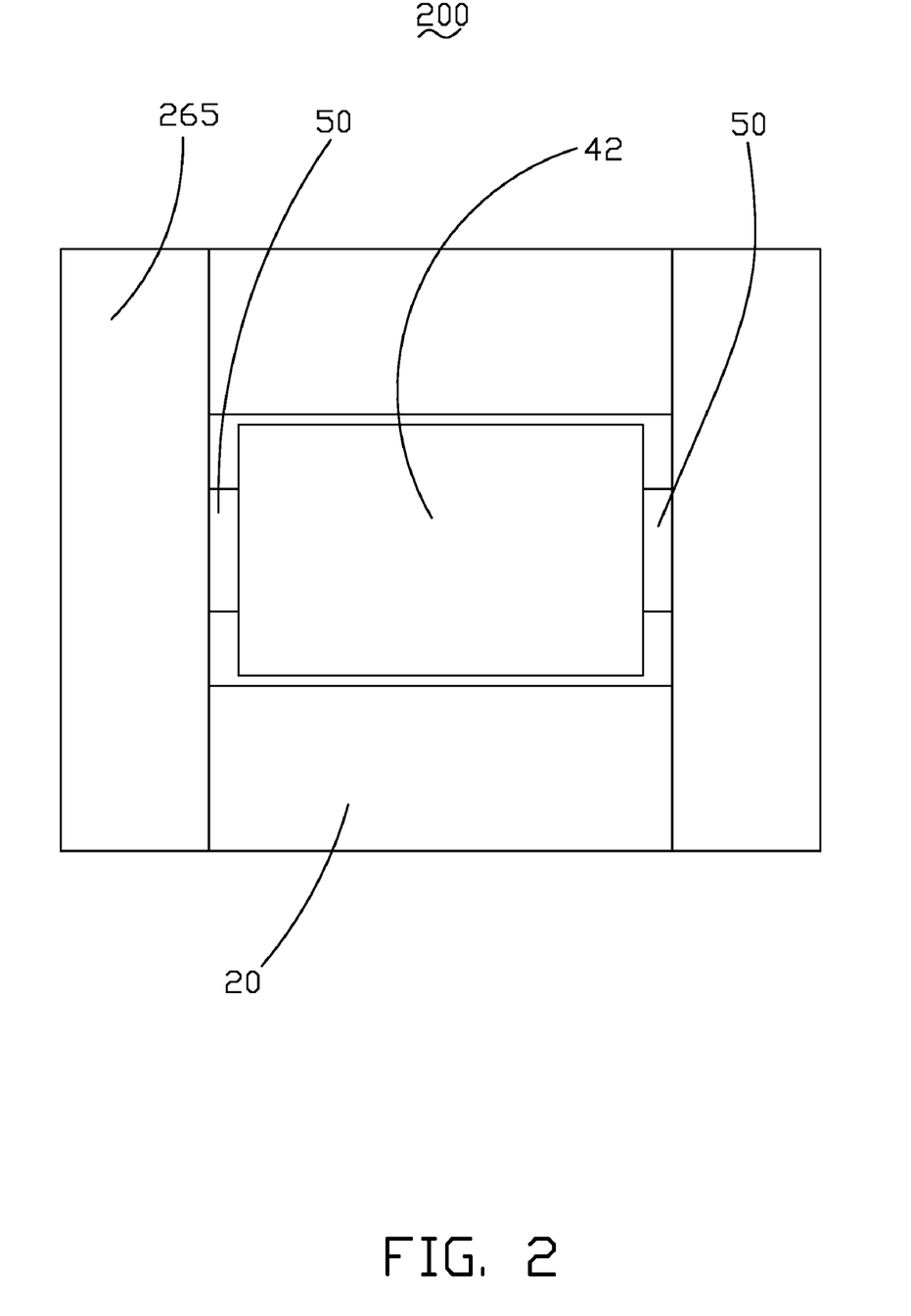
FIG. 2 is a top view of the LED package structure of FIG. 1.

Referring to FIG. 1 and FIG. 2, the LED package structure 200 comprises a substrate 20, a LED chip 40 and a colloid 50.

Figure 3:
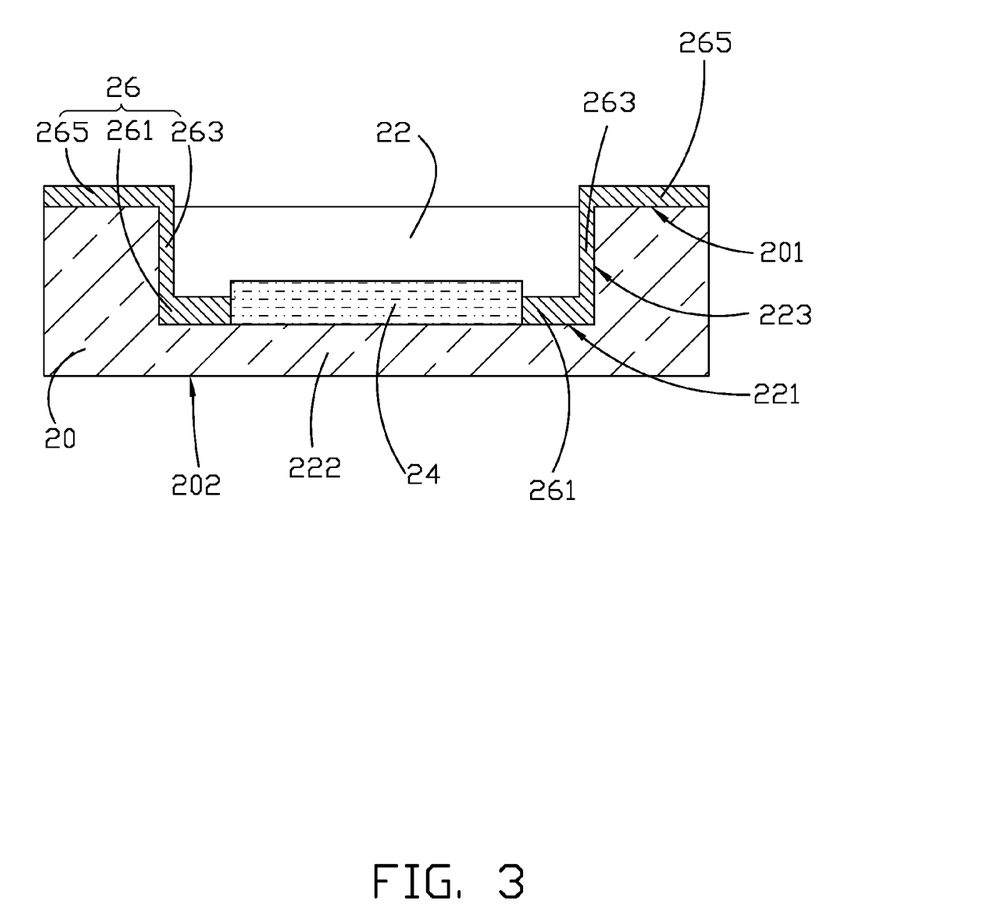
FIG. 3 is a schematic view of a substrate, on which a phosphor layer is coated, of the LED package structure of FIG. 1.
Figure 4:
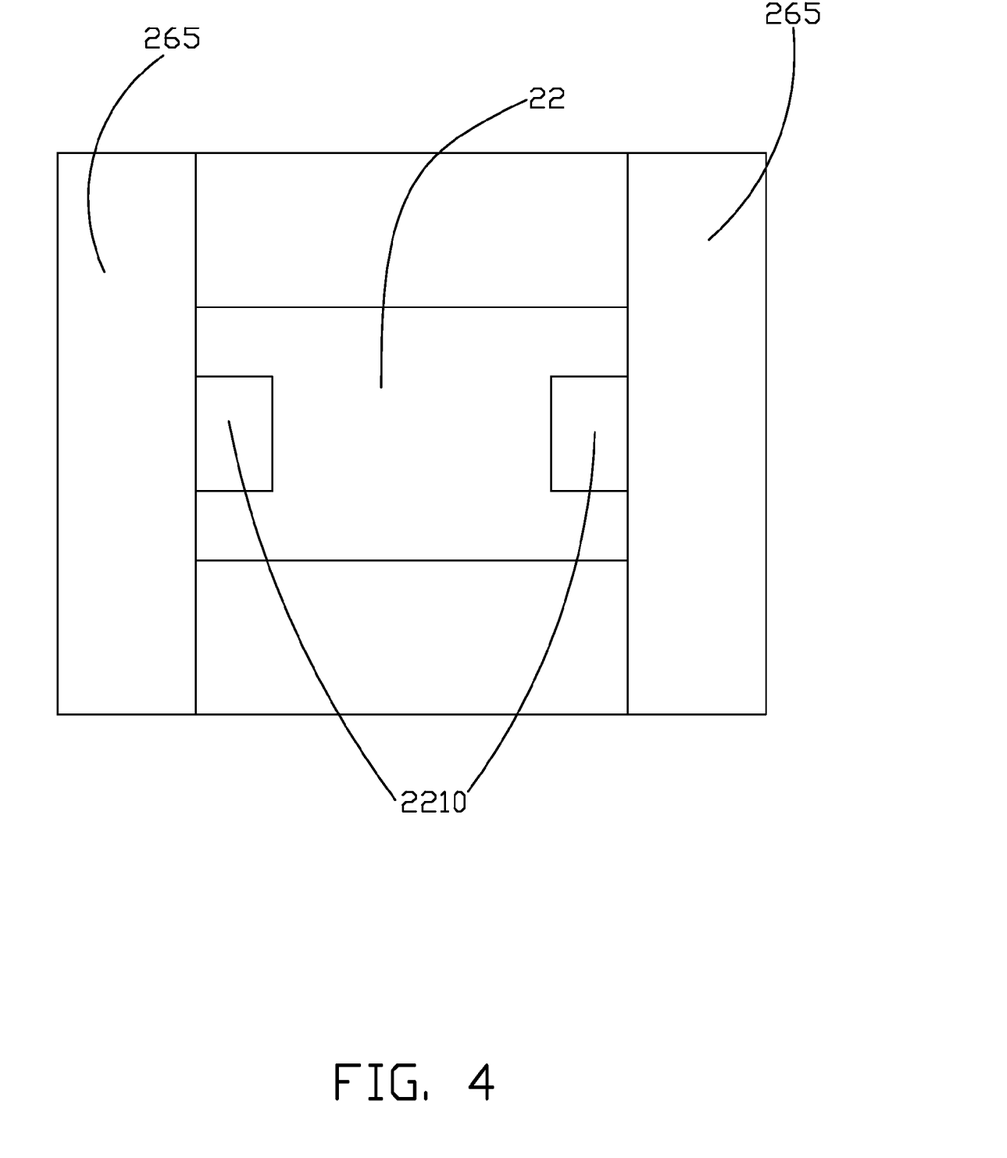
FIG. 4 is a top view of FIG. 3.

Referring to FIG. 3 and FIG. 4, the substrate 20 comprises a first surface 201 and a second surface 202 opposite to each other. An opening 22 is shaped from the first surface 201 toward the second surface 202. A bottom wall 222 between a bottom surface 221 of the opening 22 and the second surface 202 is transparent or substantially transparent. A phosphor layer 24 is coated on the bottom surface 221 of the opening 22, with two opposite parts 2210 of the bottom surface 221 respectively neighboring to two opposite side walls 223 exposed. A metal layer 26 is coated on the two exposed opposite parts 2210 of the bottom surface 221, the side walls 223 and the first surface 201. In this embodiment, the metal layer 26 comprises a first metal layer 261 coated on the two exposed opposite parts 2210 of the bottom surface 221, a second metal layer 263 coated on the side walls 223 of the opening 22 and a third metal layer 265 coated on the first surface 201 of the substrate 20. In this embodiment, the substrate 20 is formed from glass.

Figure 5:
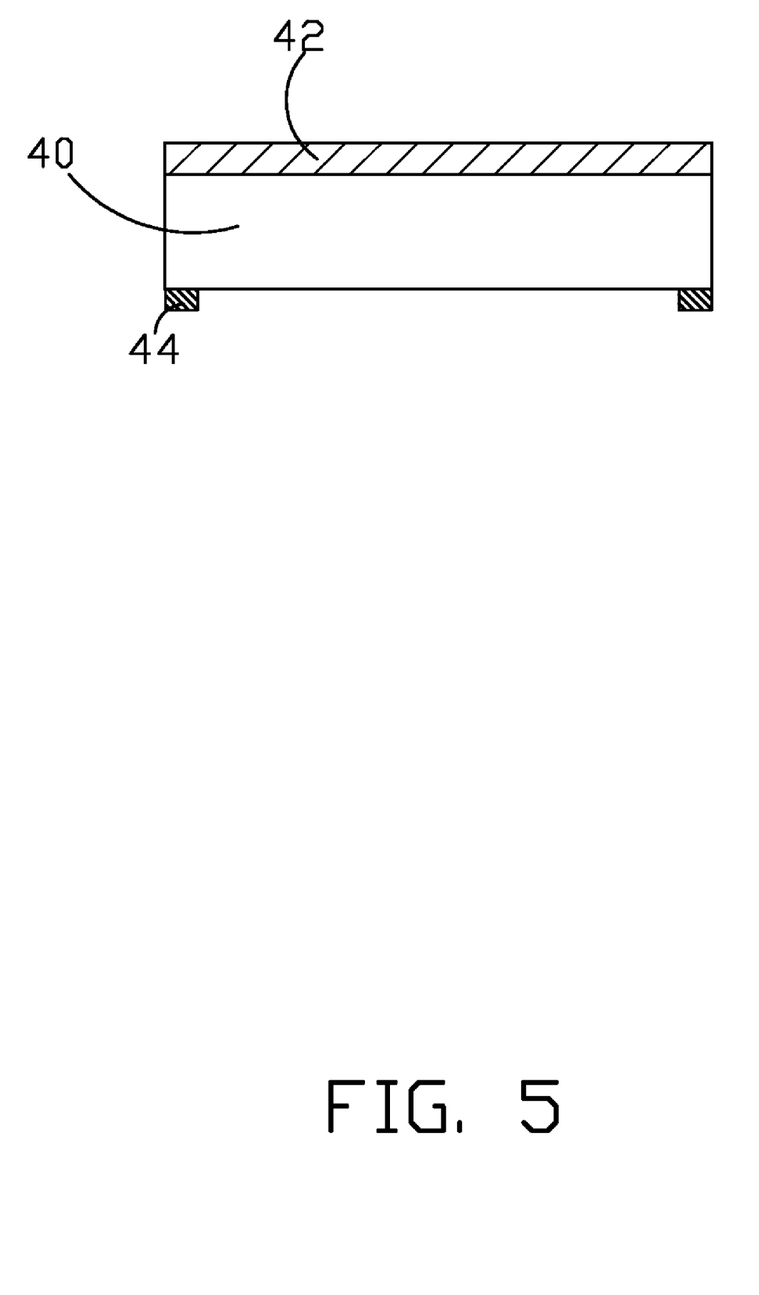
FIG. 5 is a schematic view of a LED chip of the LED package structure of FIG. 1.
Figure 8:
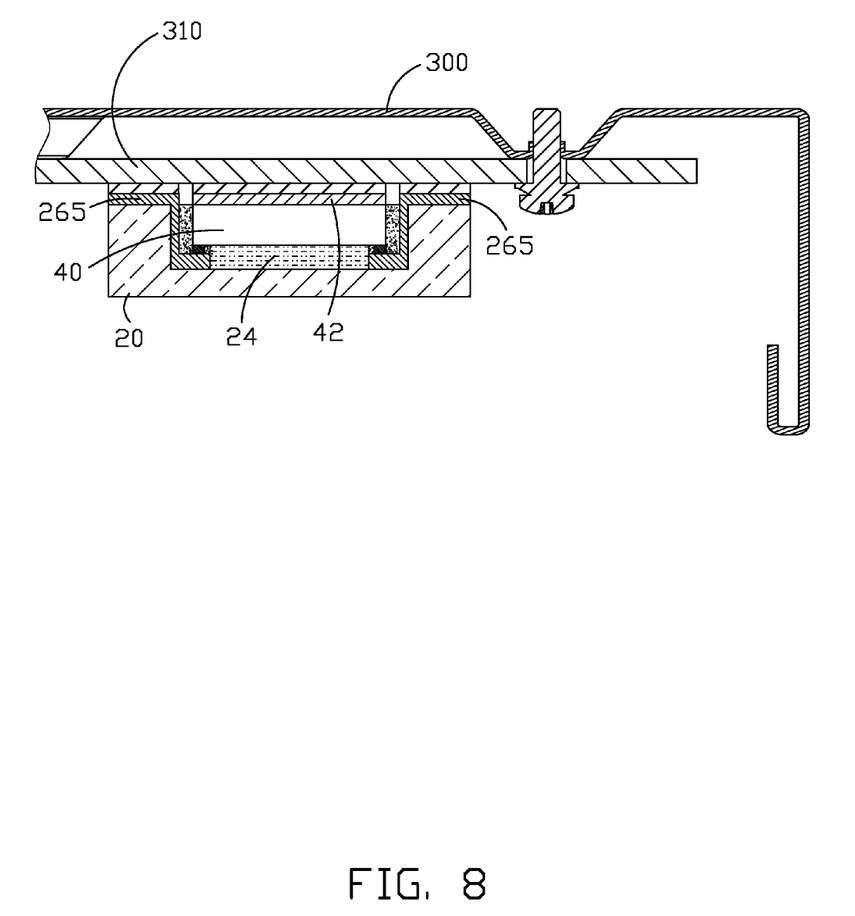
FIG. 8 is a schematic view of the LED package of FIG. 1 mounted in an electronic device.

The LED chip 40 is received in the opening 22 and configured on the phosphor layer 24. Referring to FIG. 5, the LED chip 40 comprises a pair of conductive pads 44 and a solder pad 42. The pair of conductive pads 44 are configured as two electrodes of the LED chip 40 to electrically connect to the metal layer 26. In this embodiment, the pair of conductive pads 44 electrically connect to the first metal layer 261. The solder pad 42 is configured on one side of the LED chip 40 away from the pair of conductive pads 44 and coplanar with the third metal layer 265. Referring to FIG. 8, the LED package structure 200 is soldered to another printed circuit board 310 of an electronic device 300 via the third metal layer 265 of the substrate 20 and the solder pad 42 of the LED chip 40. When the LED package structure 200 is operation, heat generated by the LED chip 40 can be effectively released out of the LED package structure 200 due to the solder pad 42 of the LED chip 40 being exposed out of the LED package structure 200, thereby potentially lengthening useful life of the LED chip 40.

Figure 6:
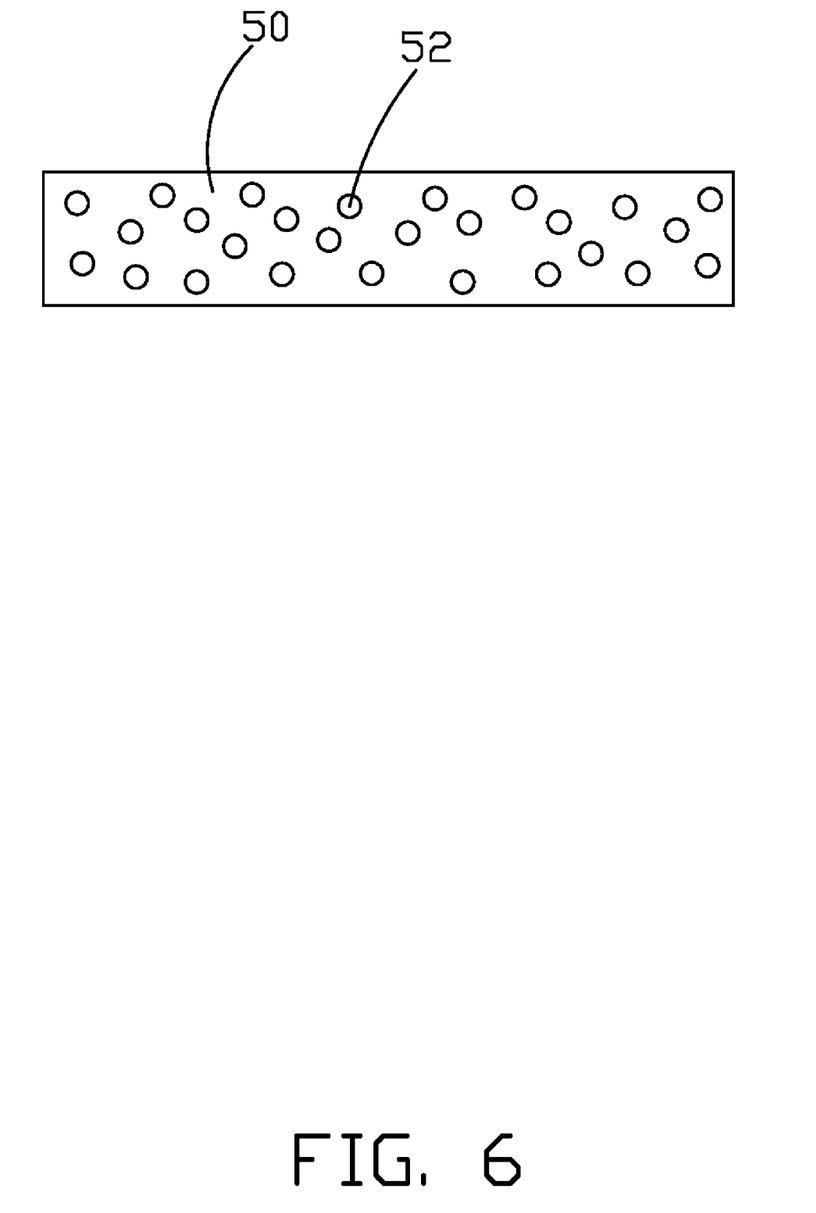
FIG. 6 is a schematic view of a colloid of the LED package structure of FIG. 1.
Figure 7:
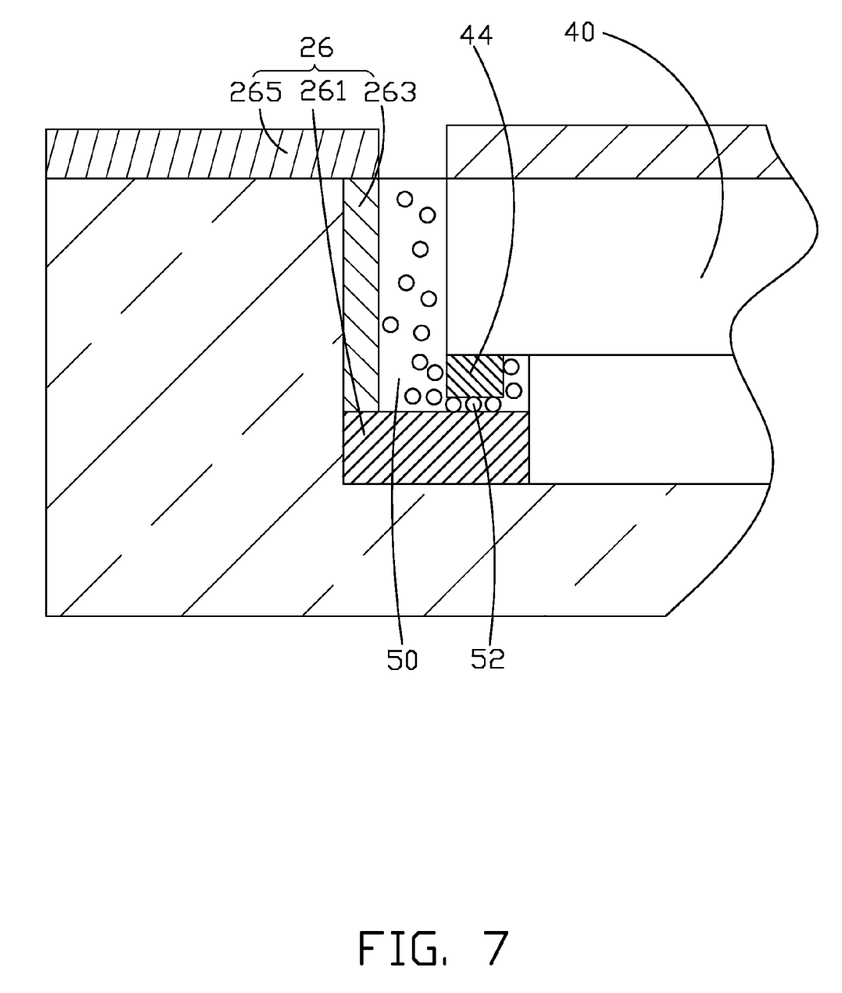
FIG. 7 is a partly enlarged schematic view of FIG. 1, showing the colloid being electrically connected between the LED chip and the substrate.

The colloid 50 is filled between the LED chip 40 and the metal layer 26 to attach the substrate 20 to the LED chip 40. Referring to FIG. 6, in this embodiment, the colloid 50 is an anisotropically conductive film (ACF) colloid, and comprises a plurality of conducting particles 52 electrically connected between the pair of conductive pads 44 and the first metal layer 261. When the LED chip 40 is mounted to the substrate 20, the LED chip 40 is put into the opening 22 and presses the colloid 50 with the pair of conductive pads 44 facing the first metal layer 261. When the pair of conductive pads 44 is close to the first metal layer 261, the LED chip 40 is electrically connected to the substrate 20 via the conducting particles 52 electrically connected between the pair of conductive pads 44 and the first metal layer 261.

In another embodiment, the pair of conductive pads 44 directly contact to the first metal layer 261 to make an electrical connection between the LED chip 40 and the first metal layer 261. The LED chip 40 is secured to the substrate 20 via soldering the pair of conductive pads 44 onto the first metal layer 261.

The phosphor layer 24 is configured on the bottom surface 221 of the opening 22 via coating process, such as screen printing process or jet printing process. Therefore the phosphor layer 24 can be equably coated on the bottom surface 221, and light generated from the LED chip 40 can be effectively transmitted out of the LED package structure 200.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A light emitting diode (LED) package structure, comprising:
   a substrate, comprising a first surface and a second surface opposite to each other, an opening shaped from the first surface toward the second surface, a phosphor layer coated on a bottom surface of the opening with two opposite parts of the bottom surface respectively neighboring to two opposite side walls of the opening exposed, a metal layer coated on the two exposed opposite parts of the bottom surface, the two opposite side walls and the first surface;
   a LED chip, received in the opening and configured on the phosphor layer, the LED chip comprising a pair of conductive pads electrically connecting to the metal layer and a solder pad configured on one side of the LED chip away from the pair of conductive pads; and
   a colloid, filled between the LED chip and the metal layer to attach the substrate to the LED chip;
   wherein the metal layer comprises a first metal layer coated on the two exposed opposite parts of the bottom surface, a second metal layer coated on the two opposite side walls and a third metal layer coated on the first surface of the substrate, the pair of conductive pads electrically connecting to the first metal layer, and the solder pad is coplanar with the third metal layer.

2. The LED package structure as claimed in claim 1, wherein the colloid comprises a plurality of conducting particles electrically connected between the pair of conductive pads and the first metal layer.

3. The LED package structure as claimed in claim 2, wherein the colloid is an anisotropically conductive film (ACF) colloid.

4. The LED package structure as claimed in claim 1, wherein the pair of conductive pads directly contact to the first metal layer to make an electrical connection between the LED chip and the first metal layer.

5. The LED package structure as claimed in claim 4, wherein the LED chip is secured to the substrate via soldering the pair of conductive pads onto the first metal layer.

6. The LED package structure as claimed in claim 1, wherein the substrate is formed from glass.

7. A light emitting diode (LED) package structure, comprising:
   a substrate, comprising a first surface and a second surface opposite to each other, an opening shaped from the first surface toward the second surface, the opening comprising a bottom surface and a side wall;
   a metal layer, coated on the bottom surface, the side wall and the first surface;
   a phosphor layer, coated on a bottom surface of the opening;
   a LED chip, received in the opening and configured on the phosphor layer, the LED chip comprising a pair of conductive pads electrically connecting to the metal layer and configured as two electrodes of the LED chip and a solder pad configured on one side of the LED chip away from the pair of conductive pads and exposed exterior of the opening; and
   a colloid, filled between the LED chip and the metal layer to attach the substrate to the LED chip;
   wherein the phosphor layer is located between the pair of conductive pads, and light generated from the LED chip travels through the phosphor layer and the substrate to be transmitted out.

8. The LED package structure as claimed in claim 7, wherein the metal layer comprises a first metal layer coated on the bottom surface, a second metal layer coated on the side wall and a third metal layer coated on the first surface of the substrate, the pair of conductive pads electrically connecting to the first metal layer, and the solder pad is coplanar with the third metal layer.

9. The LED package structure as claimed in claim 7, wherein the colloid comprises a plurality of conducting particles electrically connected between the pair of conductive pads and the metal layer.

10. The LED package structure as claimed in claim 9, wherein the colloid is an anisotropically conductive film (ACF) colloid.

11. The LED package structure as claimed in claim 7, wherein the substrate is transparent.

12. The LED package structure as claimed in claim 11, wherein the substrate is formed from glass.

* * * * *